United States Patent [19]

Huang et al.

[11] Patent Number: 5,350,698
[45] Date of Patent: Sep. 27, 1994

[54] MULTILAYER POLYSILICON GATE SELF-ALIGN PROCESS FOR VLSI CMOS DEVICE

[75] Inventors: Heng-Sheng Huang, Taipei; Kun-Luh Chen, Chu-Nan; Gary Hong, Hsin-Chu, all of Taiwan

[73] Assignee: United Microelectronics Corporation, Hsinchu, Taiwan

[21] Appl. No.: 55,567

[22] Filed: May 3, 1993

[51] Int. Cl.$^5$ .................. H01L 21/265; B05D 3/06; C23C 16/00
[52] U.S. Cl. .................. 437/26; 437/28; 437/41; 437/43; 427/526; 427/427; 427/255; 427/255.3
[58] Field of Search ............... 427/526, 527, 533, 255, 427/255.3; 437/20, 26, 27, 36, 41, 42, 43, 44, 233, 235, 238, 245, 28, 29

[56] References Cited

U.S. PATENT DOCUMENTS

| | | | |
|---|---|---|---|
| 4,329,706 | 5/1982 | Crowder et al. | 357/71 |
| 4,354,309 | 10/1982 | Gardiner et al. | 427/255.4 |
| 4,663,825 | 5/1987 | Maeda | 437/20 |
| 4,697,333 | 10/1987 | Nakahara | 437/20 |
| 4,829,024 | 5/1989 | Klein et al. | 437/189 |
| 5,093,700 | 3/1992 | Sakata | 357/23.1 |
| 5,147,814 | 9/1992 | Takeuchi | 437/44 |
| 5,147,820 | 9/1992 | Chittipeddi et al. | 437/41 |

*Primary Examiner*—Marianne Padgett
*Attorney, Agent, or Firm*—George O. Saile

[57] ABSTRACT

A new method of forming a self-aligning polysilicon gate is described. A gate silicon oxide is formed over a silicon substrate. A polysilicon layer is formed over the gate oxide. A native silicon oxide layer is formed over the polysilicon layer. A second polysilicon layer is formed over the native silicon oxide layer. Additional alternating layers of polysilicon and native silicon oxide are formed as desired. The wafer is annealed at between about 800° to 1000° C. This causes, it is believed, the silicon oxide gas from the multiple native silicon oxide layers to be exhausted resulting in the removal of all silicon oxide layers. A polycide layer is formed overlying the multiple polysilicon layers, if desired. Conventional lithography and etching techniques are used to form a gate. Ions are implanted into the substrate to form source/drain regions, using the multilayer gate as a mask. Rapid thermal annealing activates the impurities. A dielectric layer is deposited followed by conventional metallization techniques to complete construction of the integrated circuit.

25 Claims, 3 Drawing Sheets ns of the present invention. U.S. Pat. No.
MULTILAYER POLYSILICON GATE SELF-ALIGN PROCESS FOR VLSI CMOS DEVICE

BACKGROUND OF THE INVENTION

1. Field of the Invention

The invention relates to the fabrication of integrated circuit devices, and more particularly, to a method of forming a self-aligning polysilicon gate in the fabrication of integrated circuits.

2 Description of the Prior Art

In the manufacture of integrated circuits, it is a conventional process to use a polysilicon gate as a self-aligning mask for a source/drain ion implantation. This single layer polysilicon gate of the prior art, with or without an upper polycide layer, is not suitable for high energy implantation; that is, above about 100 Kev for boron, for example. As shown in FIG. 1A, the grain boundaries 6 of polysilicon gate 5 act as a channel for the implanted ions 15 to penetrate through the gate 5 and gate silicon oxide 11 and into the substrate 10 beneath the gate 5. The ions should appear only in the unmasked regions 16, but they also appear in the masked region 17 because of the ineffectiveness of the mask.

The present invention uses a multilayer polysilicon gate, with or without an upper polycide layer, as the mask for source/drain ion implantation. As seen in FIG. 1B, the grain boundaries 8 of the polysilicon gate 7 are misaligned and therefore, do not allow the passage of ions through the gate 7. The implanted ions appear only in the unmasked regions 16.

A multilayer concept has been used in a number of patents, although the layers are composed of different materials and/or they are used for different purposes than that of the present invention. U.S. Pat. No. 4,816,425 to McPherson describes a process in which a thin layer of silicon oxide is formed overlying a layer of polysilicon in order to enhance the adhesion of a sputtered metal silicide to the polysilicon. U.S. Pat. No. 4,923,526 to Harada et al describes a process for forming multiple metal layers with intervening layers formed of a compound of the metal and a reactive gas. These layers serve to suppress the growth of grains in the metal layers and to suppress electromigration of grain boundaries. U.S. Pat. Nos. 4,829,024 to Klein et al, 4,354,309 to Gardiner et al, and 5,093,700 to Sakata describe multiple polysilicon layers used to limit grain size. U.S. Pat. No. 4,329,706 to Crowder et al details an improved interconnection for integrated circuits using layers of polysilicon and metal silicide. Co-pending U.S. patent application Ser. No. 08/005,079 filed on Jan. 15, 1993 by Heng Sheng Huang describes a process using multiple polysilicon and native silicon oxide layers to solve the problem of native silicon oxide islands remaining within the polysilicon and buried contact to source/drain or emitter region interface.

SUMMARY OF THE INVENTION

A principal object of the present invention is to provide a method of source/drain implantation that provides a maximum effective channel length as well as minimum contact resistance, minimum sheet resistance of the source/drain, minimum drain overlap gate capacitance, and minimum junction capacitance.

In accordance with the object of this invention a new method of forming a self-aligning polysilicon gate is achieved. A gate silicon oxide is formed over a silicon substrate. A polysilicon layer is formed over the gate oxide. A native silicon oxide layer is formed over the polysilicon layer. A second polysilicon layer is formed over the native silicon oxide layer. Additional alternating layers of polysilicon and native silicon oxide are formed as desired. The wafer is annealed at between about 800° to 1000° C. This causes, it is believed, the silicon oxide gas from the multiple native silicon oxide layers to be exhausted resulting in the removal of all silicon oxide layers. A polycide layer is formed overlying the multiple polysilicon layers, if desired. Conventional lithography and etching techniques are used to form a gate. Ions are implanted into the substrate to form source/drain regions, using the multilayer gate as a mask. Rapid thermal annealing activates the impurities. A dielectric layer is deposited followed by conventional metallization techniques to complete construction of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1A:
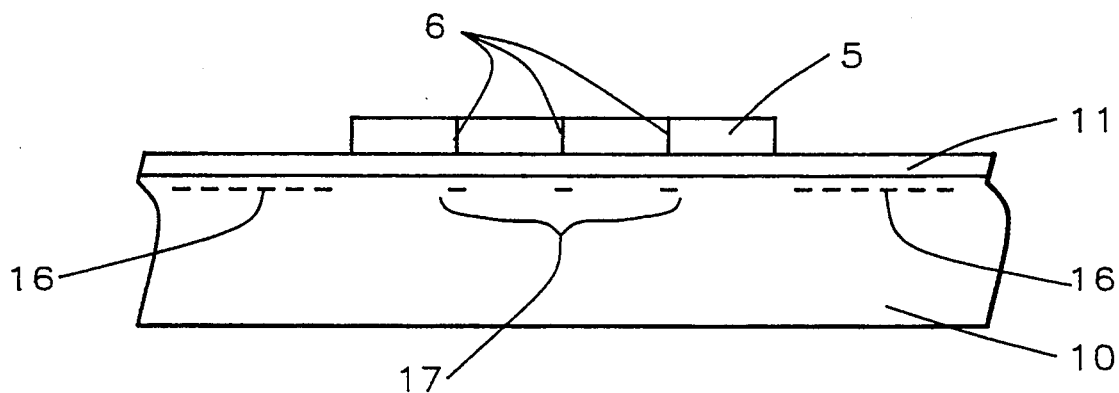
FIG. 1A schematically illustrates in cross-sectional representation a prior art process of ion implantation using a gate as a mask.
Figure 1B:
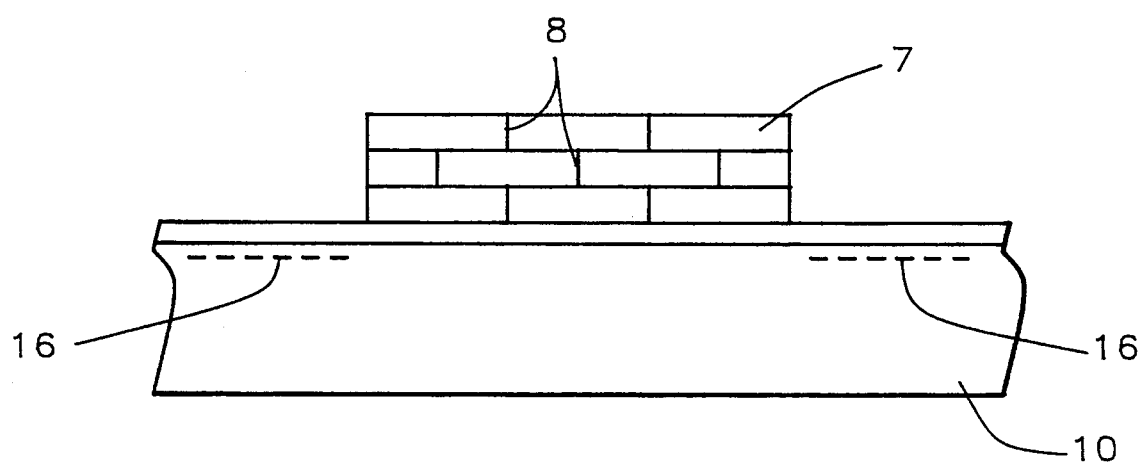
FIG. 1B schematically illustrates in cross-sectional representation a preferred embodiment, in general, of the present invention process of ion implantation using a gate as a mask.
Figure 2:
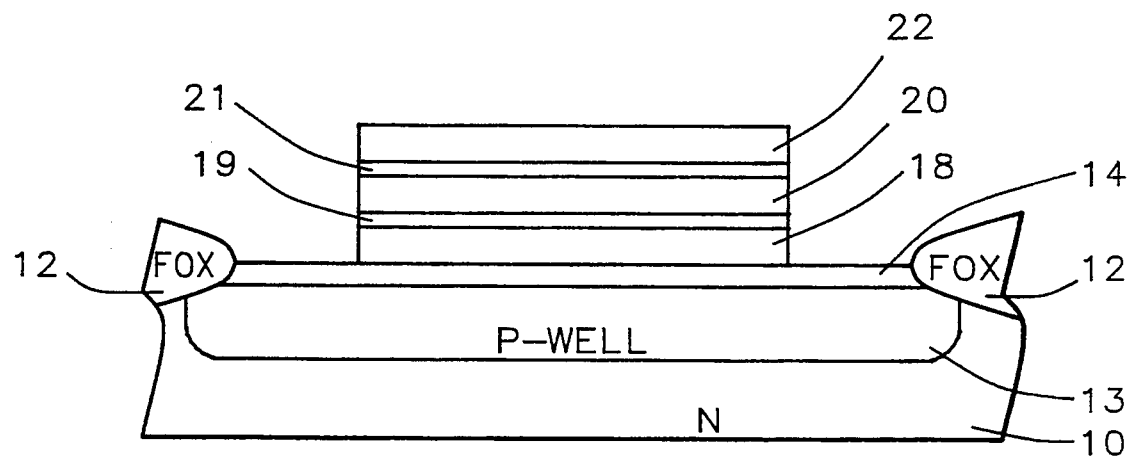
FIGS. 2, 3, 4 and 5 schematically illustrate a cross-sectional representation of one preferred embodiment of the present invention.

Referring now more particularly to FIG. 2, there is shown an illustration of the N channel portion of a partially completed, CMOS metal oxide field effect transistor (MOSFET). The semiconductor substrate 10 is preferably composed of silicon having a (100) crystallographic orientation in which a P-well 13 has been formed. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 12. Then semiconductor devices can be provided in the silicon mesas according to the following processes.

The surface of the silicon substrate 10 is thermally oxidized to form the desired gate silicon oxide 14 thickness. The preferred thickness is between about 50 to 200 Angstroms.

Now the multilayer gate structure will be formed. The polysilicon layer 18 is deposited by low pressure chemical vapor deposition (LPCVD) or ultra high vacuum chemical vapor deposition (UHVCVD) to a thickness of between about 200 to 1000 Angstroms. This layer 18 can be polycrystalline silicon or amorphous silicon. Amorphous silicon is preferred because the grain size after annealing is greater than the grain size of polycrystalline silicon. SiH₄ or Si₂H₆ gas is used for both types of silicon. For amorphous silicon, deposition takes place at a temperature of greater than about 620° C. For polycrystalline silicon, the temperature is less than about 560° C.

A thin layer 19 of native silicon oxide is formed on top of layer 18 either by adding an oxidizer to the LPCVD Chamber or by removing the wafer from the chamber and exposing it to ambient air for a few minutes between about one to 100 minutes. This native silicon oxide layer 19 has a thickness of between about 5 to 50 Angstroms, with a preferred thickness of between about 10 to 20 Angstroms.

A second polysilicon layer 20 is formed in the same way as layer 18 on top of the native silicon oxide layer 19. Formation of alternating native silicon oxide and polysilicon layers can be repeated as needed to produce native oxide layer 21 and polysilicon layer 22.

The wafer is annealed at more than about 800° C. and preferably between 800° to 1000° C. The anneal is performed at a pressure of about 100 mtorr for about 60 minutes. This causes the silicon oxide gas within the native oxide layers 19 and 21 to be exhausted through the polysilicon grain boundaries, leaving only the polysilicon layers 18, 20, and 22. The reaction is: $SiO_2$ (solid)→$Si$ (solid)+$SiO_x$ (gas), where x equals about 1.

If desired, a polycide layer 24 may now be deposited overlying the topmost polysilicon layer 22. This layer may be composed of WSi, deposited by chemical vapor deposition to a thickness of between about 500 to 3000 Angstroms. Conventional lithography and etching techniques are applied to form the gate structure as seen in FIG. 3.

The source/drain structure of the MOS FET may now be formed. FIGS. 1 through 5 show only the N channel MOSFET portion of a CMOS integrated circuit device. It is well understood by those skilled in the art that the P channel portion can be formed by simply substituting opposite polarities to those given for the N channel embodiment. The N well is used for the P channel device.

Figure 3:
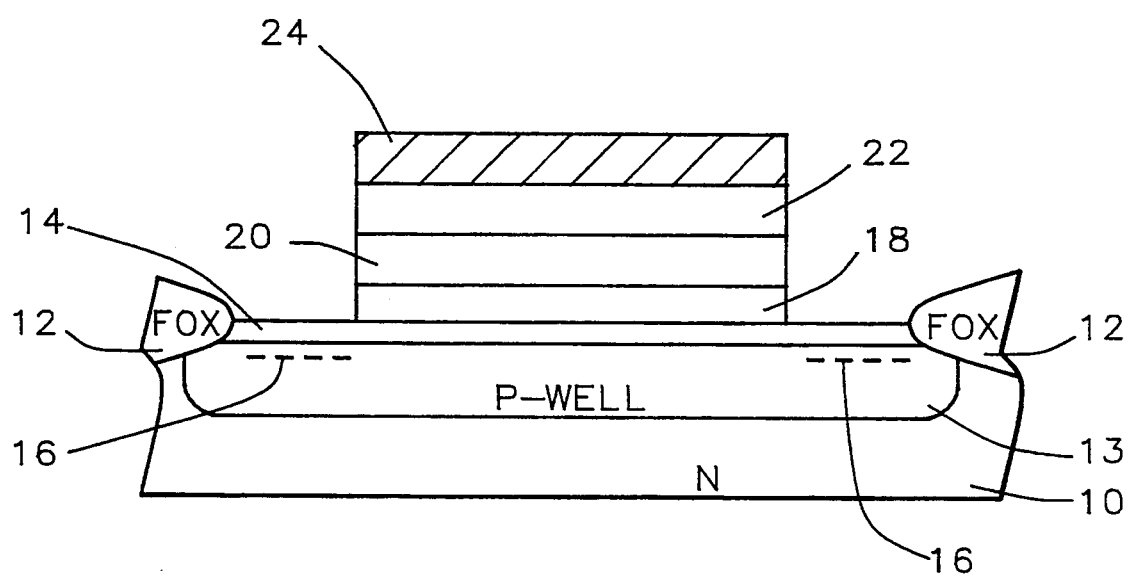

Referring now to FIG. 3, the lightly doped drain (LDD) N- regions are ion implanted using a low energy of between about 50 to 120 Kev. The typical dopant concentration for the regions 16 is P31 between about 1E13 to 5E14 (i.e. $1\times10^{13}$ to $5\times10^{14}$)atoms/cm³.

Figure 4:
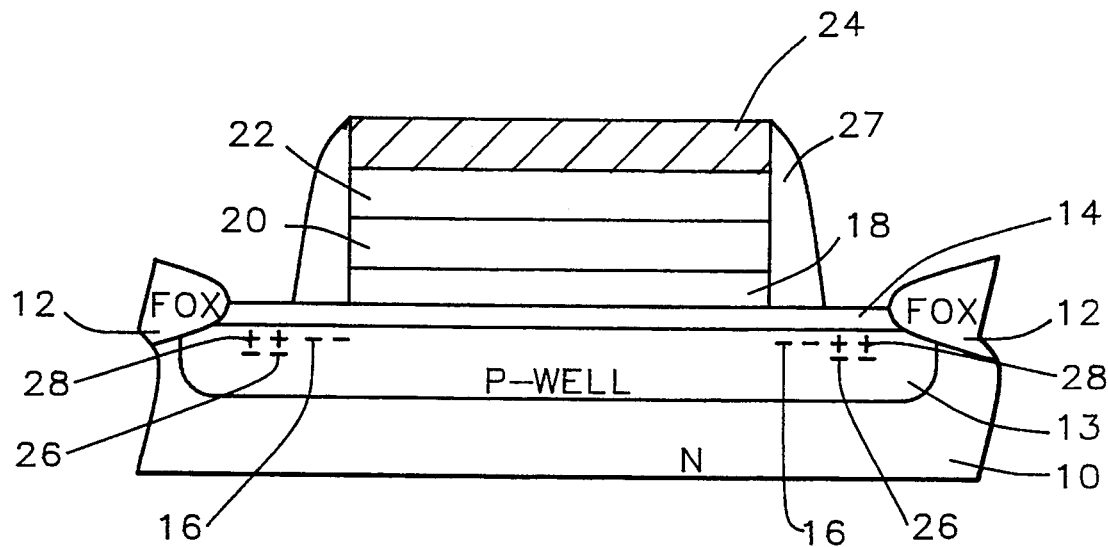

A layer of silicon dioxide is blanket deposited to a thickness of between about 500 to 3000 Angstroms over the wafer's exposed surfaces. This layer is etched using a time controlled etch to form spacers 27 on the sidewall of the gate structure, as illustrated in FIG. 4.

High energy N- regions 26 are ion implanted using an energy of between about 100 to 300 Kev, using the same dopant concentration as for the regions 16 of P31 between about 1E13 to 5E14 atoms/cm³. The LDD source/drain regions are completed by the ion implantation of N+ ions, such as As at an energy of 80 Kev to form the heavily doped regions 28, as shown in FIG. 4. The preferred dopant concentration for these regions 28 is about 5 E 15 atoms/cm³ using an energy of between about 30 to 100 Kev.

Rapid thermal annealing is now performed to activate the impurities. This annealing is performed at between about 800° to 1200° C. for 30 to 240 seconds.

Figure 5:
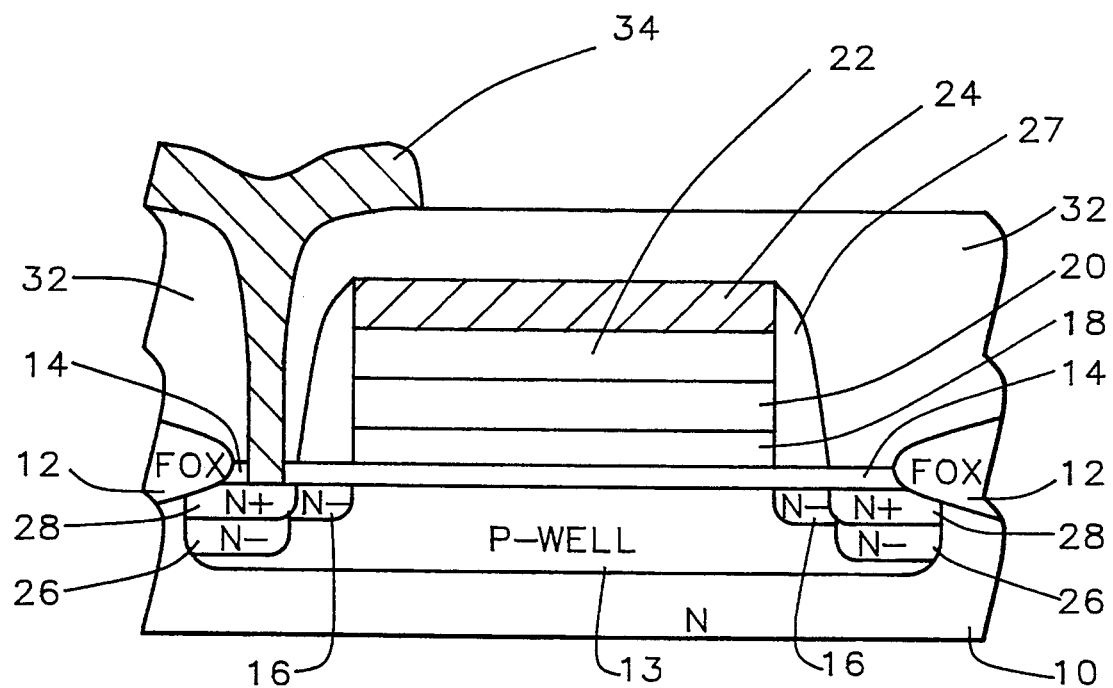

Referring now to FIG. 5, a layer of Borophosphosilicate glass or other low temperature isolation dielectric layer 32 is blanket deposited over the wafer to a thickness of between about 2000 to 10000 Angstroms. Openings are made to the source/drain regions, such as region 28 on the left side of FIG. 5, through the dielectric layer 32 and gate oxide layer 14. A blanket deposit of metal or conductive polysilicon layer 34 is formed thereover. It is then patterned to form a contact to the region 28.

The resulting structure shown in FIG. 5 provides a source/drain implantation that provides a maximum effective channel length as well as minimum contact resistance, minimum sheet resistance of the source/drain, minimum drain overlap gate capacitance, and minimum junction capacitance.

While the invention has been particularly shown and described with reference to the preferred embodiments thereof, it will be understood by those skilled in the art that various changes in form and details may be made without departing from the spirit and scope of the invention.

What is claimed is:

1. The method of forming a self-aligned polysilicon gate in an integrated circuit comprising:
    forming field silicon oxide regions in and on a semiconductor substrate;
    forming a gate silicon oxide layer overlying said semiconductor substrate between said field silicon oxide regions;
    depositing a first layer of polysilicon overlying said gate silicon oxide;
    forming a native silicon oxide layer having a thickness greater than 5 Angstroms over said first polysilicon layer;
    depositing a second layer of polysilicon over said native silicon oxide layer wherein silicon grain boundaries of said second layer of polysilicon are misaligned with silicon grain boundaries of said first layer of polysilicon;
    a first annealing of said silicon substrate at a temperature of more than about 800° C. whereby silicon oxide gas from said native silicon oxide layer is exhausted effectively removing said native silicon oxide layer;
    etching away said polysilicon layers not covered by a mask to form said polysilicon gate;
    implanting a first set of ions into said semiconductor substrate using said gate as a mask;
    forming spacers on the vertical sidewalls of said gate;
    implanting a second set of ions into said substrate using said gate as a mask wherein said mask is effective because said misaligned silicon grain boundaries of said polysilicon layers do not allow said ions to diffuse into said silicon substrate under said mask;
    implanting a third set of ions into said substrate using said gate as a mask;
    a second annealing of said semiconductor substrate to simultaneously activate said first, second, and third set of implanted ions;
    depositing an insulating layer over said gate, gate silicon oxide, and field silicon oxide regions; and
    providing by metallization techniques electrical connections to complete formation of said integrated circuit.

2. The method of claim 1 wherein said polysilicon gate is composed of any number of alternating polysilicon and native silicon oxide layers wherein there are at least two layers of polysilicon.

3. The method of claim 1 wherein said layers of polysilicon are amorphous silicon as deposited and wherein said first annealing causes said amorphous silicon layers to be transformed into polysilicon layers and wherein said amorphous silicon layers are each between about 200 to 1000 Angstroms in thickness.

4. The method of claim 1 wherein said layers of polysilicon are polycrystalline silicon as deposited and are between about 200 to 1000 Angstroms in thickness.

5. The method of claim 1 wherein said first layer of polysilicon is deposited within a chemical vapor deposition chamber and wherein said native silicon oxide layer having a thickness of between about 5 to 50 Angstroms is formed by adding oxidizer to said chemical vapor deposition chamber.

6. The method of claim 1 wherein said native silicon oxide layer is between about 5 to 50 Angstroms in thickness and is formed by exposing said semiconductor substrate to the ambient atmosphere for a time of between 1 and 100 minutes at room temperature.

7. The method of claim 1 wherein said first annealing is performed at a temperature of between about 800° and 1000° C. for about 60 minutes.

8. The method of claim 1 wherein a metal silicide layer is formed overlying topmost said polysilicon layer after said first annealing and wherein said metal silicide layer is patterned along with said polysilicon layers to form a polycide gate.

9. The method of claim 8 wherein said polycide gate is composed of WSi and is deposited to a thickness of between about 500 and 3000 Angstroms.

10. The method of claim 1 wherein said first ion implantation uses phosphorus ions at a dosage of between 1 E 13 and 5 E 14 atoms/cm$^2$ and a low energy of between about 50 and 120 Kev.

11. The method of claim 1 wherein said second ion implantation uses phosphorus ions at a dosage of between 1 E 13 and 5 E 14 atoms/cm$^2$ and high energy of between about 100 and 300 Kev.

12. The method of claim 1 wherein said third ion implantation uses arsenic (As) at a dosage of greater than 1 E 15 atoms/cm$^2$ and energy of between 60 and 200 Kev.

13. The method of claim 1 wherein said annealing to activate said first, second, and third ion implantations is done at between about 800° and 1200° C. for a duration of between about 30 and 240 seconds.

14. The method of claim 1 wherein said insulating layer is composed of phosphosilicate glass and has a thickness of between about 2000 and 10000 Angstroms.

15. The method of claim 1 wherein said first, second, and third ion implantations form N+ source/drain regions within said semiconductor substrate.

16. The method of constructing a multilayer polysilicon gate wherein said gate acts as a mask for ion implantation comprising:

providing on a semiconductor substrate a layer of gate silicon oxide;

depositing a first layer of polysilicon over said layer of gate silicon oxide;

forming at least one layer of native silicon oxide having a thickness of between about 5 to 50 Angstroms on top of said polysilicon layer; and depositing at least one second layer of polysilicon over said native silicon oxide layer whereby silicon grain boundaries of said first and at least one second layer of polysilicon will be misaligned thereby providing an effective mask for high energy ion implantation of between about 60 to 120 KeV, and removing said native silicon oxide by annealing at a temperature of between about 800° to 1000° C. in a vacuum before ion implantation.

17. The method of claim 16 wherein said layers of polysilicon are amorphous silicon as deposited and wherein said semiconductor substrate is heated causing said amorphous silicon layers to be transformed into polysilicon layers and wherein said amorphous silicon layers are each between about 200 to 1000 Angstroms in thickness.

18. The method of claim 16 wherein said layers of polysilicon are polycrystalline silicon and are 200 to 1000 Angstroms in thickness.

19. The method of claim 16 wherein said first layer of polysilicon is deposited within a chemical vapor deposition chamber and wherein said native silicon oxide layer is formed by adding oxidizer to said chemical vapor deposition chamber.

20. The method of claim 16 wherein said native silicon oxide layer is formed by exposing said substrate to the ambient atmosphere for a time of between 1 to 100 minutes at room temperature.

21. The method of claim 16 wherein there are formed multiple alternating layers of polysilicon and native silicon oxide.

22. The method of claim 16 wherein after said multiple layers of polysilicon and native silicon oxide are formed, said silicon substrate is annealed for about 60 minutes in a vacuum of about 100 mtorr causing silicon oxide gas from said native silicon oxide layer to be exhausted effectively removing said native silicon oxide layer.

23. The method of claim 16 wherein a metal silicide layer is formed overlying topmost said polysilicon layer.

24. The method of claim 23 wherein said metal silicide layer is composed of WSi and is deposited to a thickness of between about 500 and 3000 Angstroms.

25. The method of claim 23 wherein said ion implantation forms source/drain regions within said semiconductor substrate.

* * * * *